United States Patent
Saito et al.

[11] Patent Number: 5,845,803
[45] Date of Patent: Dec. 8, 1998

[54] WATERPROOF CASING STRUCTURE FOR ELECTRONIC EQUIPMENT

[75] Inventors: Koji Saito; Toshiya Inubushi, both of Hyogo, Japan

[73] Assignee: Mitsubishi Denki Kabushiki Kaisha, Tokyo, Japan

[21] Appl. No.: 524,430

[22] Filed: Sep. 6, 1995

[30] Foreign Application Priority Data

Jan. 27, 1995 [JP] Japan ................................... 7-011451

[51] Int. Cl.⁶ ................................................. B65D 53/00
[52] U.S. Cl. ........................ 220/378; 220/806; 220/222; 220/241
[58] Field of Search ................................. 220/378, 578, 220/358, 222, 241, 804, 806; 215/231; 206/710, 711, 712; 92/245, 249

[56] References Cited

U.S. PATENT DOCUMENTS

| | | | |
|---|---|---|---|
| 620,663 | 3/1899 | McCarty | 215/231 |
| 1,876,989 | 9/1932 | Lormor | 220/378 X |
| 2,426,800 | 9/1947 | Triplett | 220/378 |
| 2,447,493 | 8/1948 | Daniel | 220/378 X |
| 2,465,755 | 3/1949 | Sanders | 220/578 X |
| 2,599,212 | 6/1952 | Triplett | 220/378 X |
| 2,700,774 | 2/1955 | Smith | 220/378 X |
| 2,823,823 | 2/1958 | Mustee | 220/358 |
| 3,164,289 | 1/1965 | Cocchiarella | 220/578 |
| 3,381,863 | 5/1968 | Towns | 92/245 |
| 3,575,546 | 4/1971 | Liautaud . | |
| 3,635,369 | 1/1972 | Lasswell et al. | 220/378 X |
| 4,378,726 | 4/1983 | Stoll | 92/249 X |
| 4,438,864 | 3/1984 | Helms | 229/5.5 X |
| 4,484,512 | 11/1984 | Dechavanne | 92/249 X |
| 4,515,378 | 5/1985 | Marshall | 92/245 X |
| 5,153,380 | 10/1992 | Chang . | |

FOREIGN PATENT DOCUMENTS

| | | | |
|---|---|---|---|
| 0392631 | 10/1990 | European Pat. Off. . | |
| 1131300 | 2/1957 | France . | |
| 1451570 | 12/1966 | France . | |
| 2652262 | 5/1978 | Germany . | |
| 487173 | 6/1938 | United Kingdom | 220/378 |
| 522566 | 6/1940 | United Kingdom . | |

*Primary Examiner*—Stephen K. Cronin
*Assistant Examiner*—Robin A. Hylton
*Attorney, Agent, or Firm*—Rothwell, Figg, Ernst & Kurz

[57] ABSTRACT

A waterproof casing for an electronic equipment includes a box-shaped case member and a plane-shaped cover member including a sheet-form sealing gasket extending from the overall periphery of the cover member. The cover member is inserted and fixed to the case member with the gasket sliding into and pressing against the inner surface of the case member to secure a tight waterproof seal. The cover member also can be partially plate-shaped and partially box-shaped. The waterproof casing structure reduces the size, particularly height, of the casing and simplifies assembly.

23 Claims, 12 Drawing Sheets

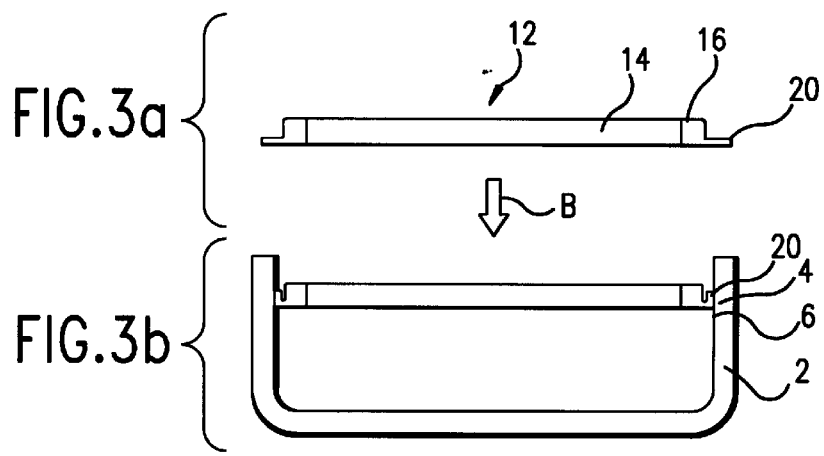
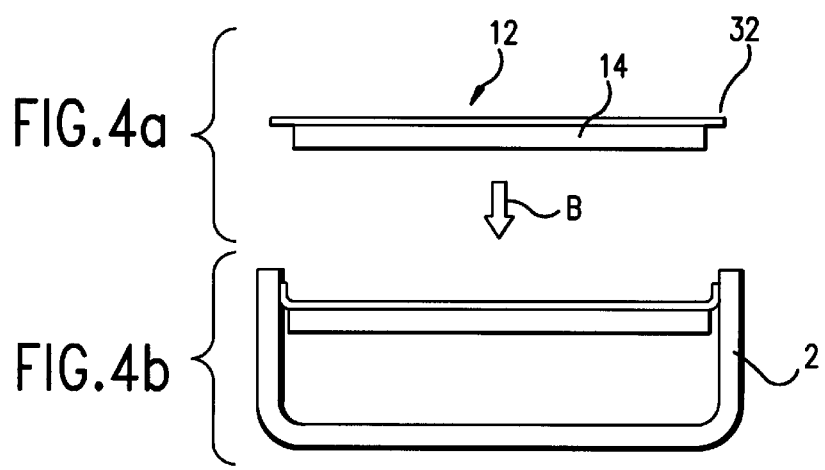
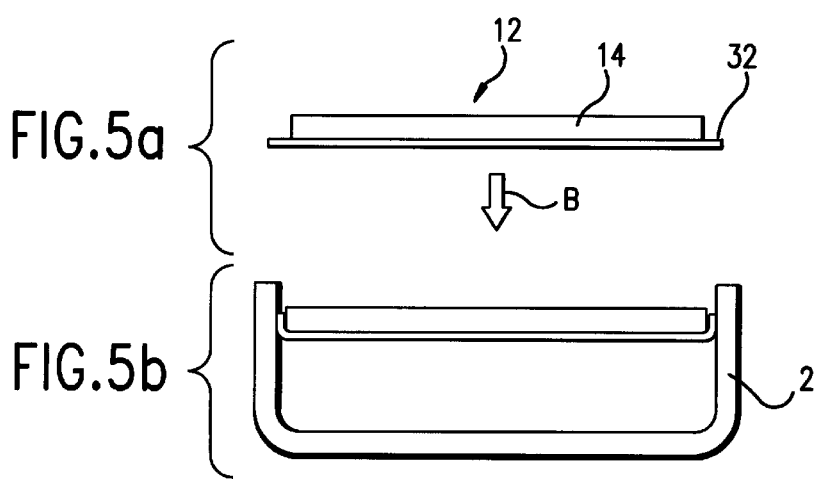

WATERPROOF CASING STRUCTURE FOR ELECTRONIC EQUIPMENT

BACKGROUND OF THE INVENTION

1. Field of the Invention

The present invention relates to waterproof casing structures for electronic equipment.

2. Description of the Related Art

A conventional waterproof casing structure for electronic equipment is shown in FIGS. 21 and 22. FIG. 22 is a cross-sectional view of the casing of FIG. 21.

A box-shaped case housing 2 and a case cover 12 are engaged each other as shown in FIG. 22. An annular rubber gasket 16 is provided around the entire periphery of the portion of housing 2 which engages with the cover 12. The gasket 16 is provided to prevent water from seeping into the housing 2 in which delicate electronic equipment is contained. The housing 2 and cover 12 are generally made of thermoplastic resin.

According to such conventional waterproof structure, a groove portion for accommodating the waterproof gasket 16 must be provided in the cover 12 and a projection is needed in the housing 2 in order to press the gasket 16 firmly against the cover 12 so as to provide a waterproof seal. As such, an extra thickness K is added to the casing structure to accommodate the gasket and to provide the necessary sealing force. This structure thus undesirably adds thickness to the casing, when reduced thickness is desired.

Further, if the casing has a complicated shape, the waterproof gasket must also have a complicated shape conforming to the shape of the casing, making it difficult to insert the gasket for assembly of the casing.

Further, when the size of the casing is reduced, the thickness or diameter of the gasket must also be proportionately reduced. However, such a small diameter waterproof gasket is fragile and may be readily deformed or broken when assembled with the casing.

SUMMARY OF THE INVENTION

In view of the aforementioned problems, an object of the present invention is to provide a waterproof casing structure for electronic equipment which achieves a reduction in the thickness of the casing.

Another object of the invention is to provide a waterproof structure in which a waterproof gasket is formed as one unit with the casing so as to reduce the number of parts and simplify the assembly process.

A further object of the invention is to provide an improved manufacturing method suited for the waterproof casing structure.

To achieve the above objects, the present invention provides a waterproof casing structure for electronic equipment which comprises a case member, a cover member detachably joined to the case member to form a casing and a gasket portion provided on the cover member. The gasket portion is brought into sliding contact with the surface of the case member.

In a preferred form, the case member has a box-like form. The cover member has a plate form. The gasket portion is shaped into a thin sheet form which protrudes from a peripheral end portion of the plate-form cover member. The gasket portion is brought into contact with an inner surface of the case member along the direction of insertion of the cover member.

In another preferred form, the gasket portion has a thin plate form and protrudes from the end portion of the plate-form cover member. The thin plate gasket portion is joined to a major surface of the plate-form cover member.

In yet another preferred form, part of the cover member is formed as a box-type member, for accommodating components such as a battery. The gasket portion of the box-type member is provided on an end surface of the box-type member at a contacting or butting side thereof. The gasket portion is brought into butting contact with an end surface of the case member.

In another preferred form, the gasket member extends in a direction which forms a predetermined oblique angle with respect to the surface of the cover member. In another preferred form, the second case member and the packing member are integrally formed as one unit.

According to yet another preferred form, the case and cover members are formed of a thermoplastic resin, while the gasket member is made of a thermoplastic elastic resin.

Other and further objects, features and advantages of the invention will appear more fully from the following description.

BRIEF DESCRIPTION OF THE DRAWINGS

The present invention will be more clearly understood with reference to the following drawings in which like reference numerals refer to like elements, and in which:

FIGS. 3(a) and 3(b) are cross-sectional views of a second preferred embodiment of the electronic equipment casing according to the present invention;

FIGS. 4(a) and 4(b) are cross-sectional views of a third preferred embodiment of the electronic equipment casing according to the present invention;

FIGS. 5(a) and 5(b) are cross-sectional views of a fourth preferred embodiment of the electronic equipment casing according to the present invention;

DESCRIPTION OF THE PREFERRED EMBODIMENTS

The present invention will now be described in further detail by way of example with reference to the accompanying drawings.

Figure 1:
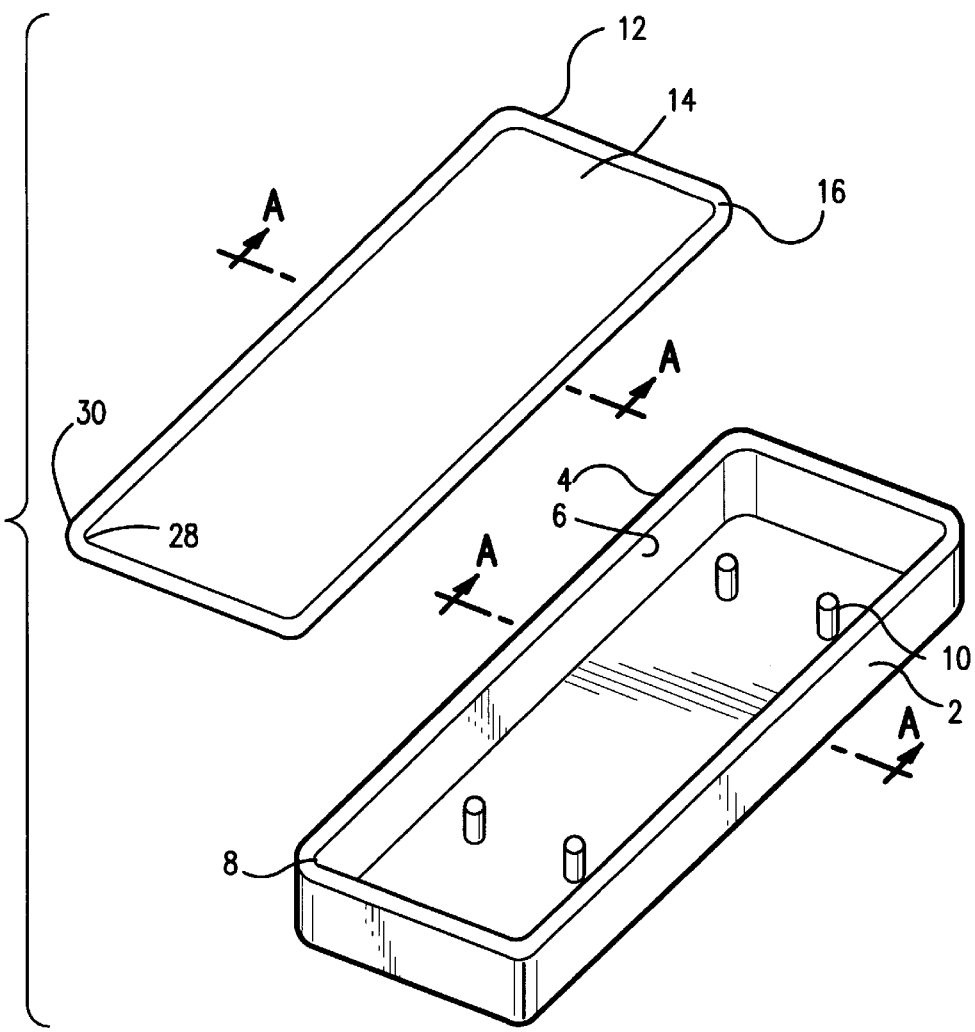
FIG. 1 is a perspective view of a first preferred embodiment of an electronic equipment waterproof casing according to the present invention.
Figure 2A:
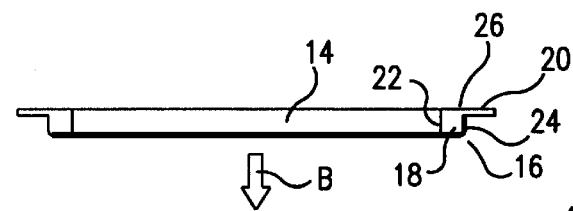
FIGS. 2(a) and 2(b) are cross-sectional views of the electronic equipment casing taken along line A—A of FIG. 1.
Figure 2B:
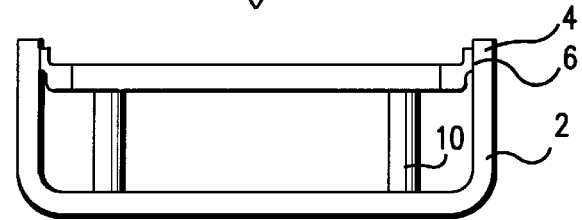

Referencing FIG. 1 and FIGS. 2(a) and 2(b), the casing is divided into two parts, i.e. a lower case member and an upper case or cover member. Lower case member 2 has a box-like shape with an upper opening having a rim portion 4, and an inner wall portion 6 for receiving cover member 12. The lower case member 2 has rounded portions 8 at the four corners thereof. Protrusions 10 extend from the inner bottom surface of the case member 2, to receive an upper case member which is described later. The lower case member 2 is typically made of a thermoplastic resin.

Cover member 12 is composed of a plate member 14, with major surfaces, and a sealing or gasket member 16. The plate member 14 is typically made of a thermoplastic resin and the gasket member 16 is preferably also made of a thermoplastic elastic resin formed integrally with the plate member 14.

The gasket member 16 extends around the entire periphery of the end surface of the plate member 14. As shown in FIG. 2(a), gasket member 16 is composed of a base portion 18 and a sheet portion 20. The sheet portion 20 extends horizontally outward from the base portion 18. The base portion 18 is joined to the plate member 14 at joint surface 22. The outer end surface 24 of the base portion 18 extends orthogonally to the sheet portion 20. Round corner portion 26 is provided as a smooth transition surface between portions 18 and 20.

The upper surfaces of plate member 14 and gasket member 16 are level with each other. The base portion 18 of the gasket member 16 has the same thickness as the plate member 14, while the sheet portion 20 is thinner than the base portion 18. The plate member 14 has a rounded section 28 at its corners and the gasket member 16 has a corresponding rounded portion 30.

The opening of the case member 2 is larger than the dimensions of the plate member 14 but is smaller than the dimensions of the case 12 including the plate member 14 and the gasket member 16. Similarly, the rounded portion 8 of the case 2 is greater than the rounded portion 28 of the plate member 14 and is less than the rounded portion 30 of the gasket member 16.

In assembly or operation, the cover 12 is brought into engagement with the case 2 in the direction of the arrow B in FIG. 2(a). The cover 12 and the case 2 are shown engaged in FIG. 2(b). When the cover 12 and the case 2 are brought into engagement, the end surface portion 24 of the gasket member 16 fits within the inner wall portion 6 of the case 2. Since the dimensions of the gasket member 16 including the sheet portion 20 are larger than the dimensions of the opening of the case 2, the sheet portion 20 is bent upward against the inner wall portion 6 as shown in FIG. 2(b), while further motion of the plate member 14 is prevented by the projections 10. The sheet portion 20 thus applies a deflection load to the inner wall portion 6.

The sealing contact of the sheet portion 20 with the inner wall portion 6 prevents entry of water into the casing interior. The deflection force with which the sheet portion 20 is in contact with the inner wall portion 6 can be varied by varying the thickness of the sheet portion 20.

The rounded structure of section 26 of the gasket member 16 prevents breakage of the sheet portion 20 when it is bent and stress is applied to the section 26. The radius of the rounded portion 8 is adjustably chosen. If the radius of the portion 8 is too small, the sheet portion 20 is irregularly bent and may not be properly fitted against the wall portion 6. The larger the radius of the rounded portion 8, the greater the amount of the sheet portion 20 fitted at the portion 30 along the inner wall portion 6 that will not be bent upward.

Thermoplastic material is preferably used in the manufacture of the electronic equipment casing. A thermoplastic resin is used for the plate member 14 and a thermoplastic elastic resin is used for the gasket member 16. The thermoplastic resins are heat bonded to each other by injection molding. Alternatively, a two-color molding (double molding) can be performed. According to such process, either the gasket member 16 is inserted into an injection molding die of the plate member 14 or the plate member 14 is inserted into an injection molding die of the gasket member 16. Thereafter, the plate member 14 and the gasket member 16 are heat bonded to each other to form a unit, for example, by injection molding.

Figure 22:
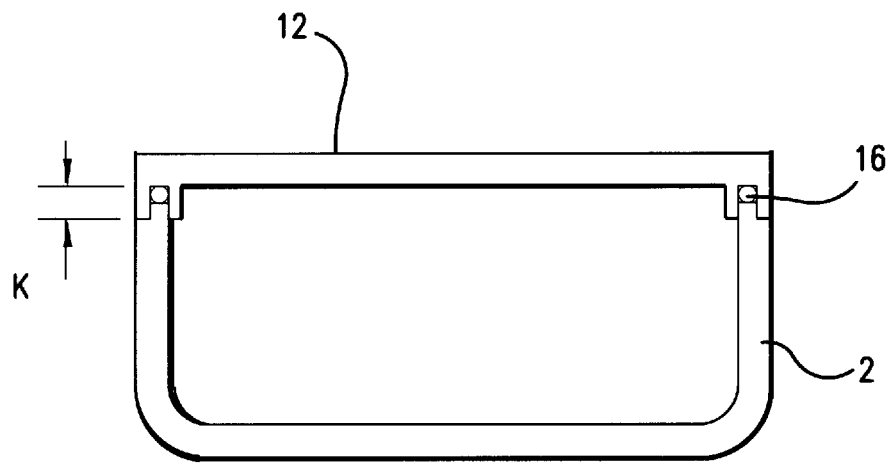
FIG. 22 is a cross-sectional view of the conventional electronic equipment casing shown in FIG. 21.
Figure 21:
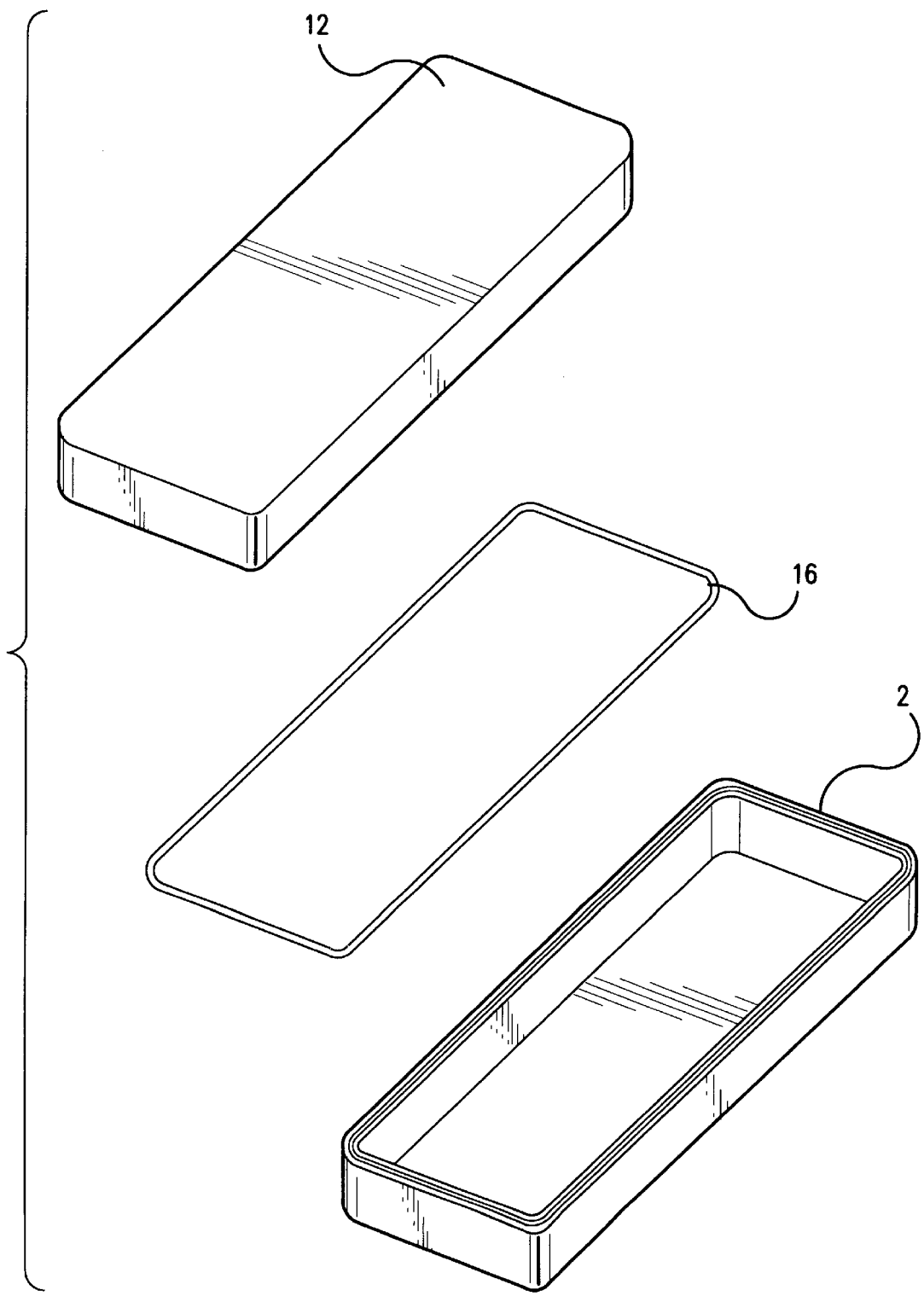
FIG. 21 is a perspective view of a conventional electronic equipment casing.

In the waterproof casing structure according to the present invention, the thickness of the casing can be readily reduced, because the height or thickness of the cover member 12 is not added to the height of the case member 2 as with the conventional casing shown in FIGS. 21 and 22. Further, since the gasket member 16 is formed integrally with the plate member 14 to form the case 12, the number of parts can be reduced and assembly can be simplified.

Another embodiment of the invention is shown in cross-sectional view in FIGS. 3(a) and 3(b). In this embodiment, an upper cover 12 has a plate portion 14 and a gasket 16 joined together in the opposite orientation from that shown in FIGS. 2(a) and 2(b). That is, the sheet portion 20 extends from the lower surface of the plate 14.

The cross-sectional view of FIGS. 4(a) and FIG. 4(b) shows another embodiment of the invention, wherein the upper case 12 in FIG. 4(a) is brought into engagement with the lower cover 2 as shown in FIG. 4(b). The upper cover 12 is composed of a plate member 14 and a sheet member 32 integrally formed over the plate member 14. The sheet member 32 is larger in length and width than the plate member 14 and extends over the edges of the plate member 14. The sheet member 32 is preferably made of a thermoplastic elastic resin. The upper cover 12 of this embodiment can be manufactured by press molding or RIM molding. Thus, the sheet 32 can be formed of rubber, such as silicone rubber.

Another embodiment of the invention is shown in FIGS. 5(a) and 5(b). In this embodiment, the sheet member 32 is joined to the plate member 14 on the opposite side of the embodiment of FIGS. 4(a) and (b). This embodiment is advantageous to secure the binding of the sheet 32 to the plate member 14 because a force is applied to the sheet 32 in the direction of the plate member 14.

Figure 6:
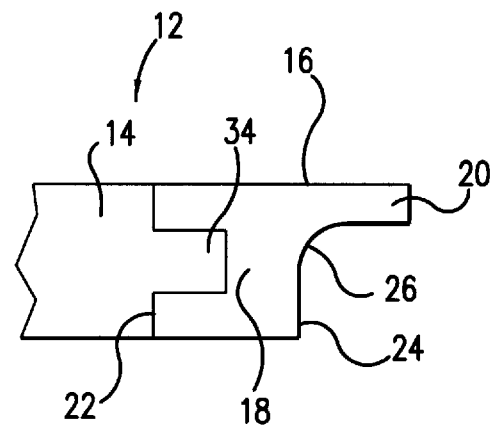
FIG. 6 is an enlarged cross-sectional view of an alternate embodiment of the electronic equipment casing according to the present invention.

Another embodiment of the invention is shown in FIG. 6. This is an enlarged partial cross-sectional view of the upper cover 12. According to this embodiment, plate member 14 of the upper cover 12 has a projecting portion 34 which extends from end surface 22 into the gasket member 16. In this way, the gasket member 16 can be heat bonded to the plate member 14 through a larger interface, so that the heat bonding strength between the gasket member 16 and the plate member 14 is increased. Consequently, the gasket member 16 resists peeling off the plate 14.

Figure 7:
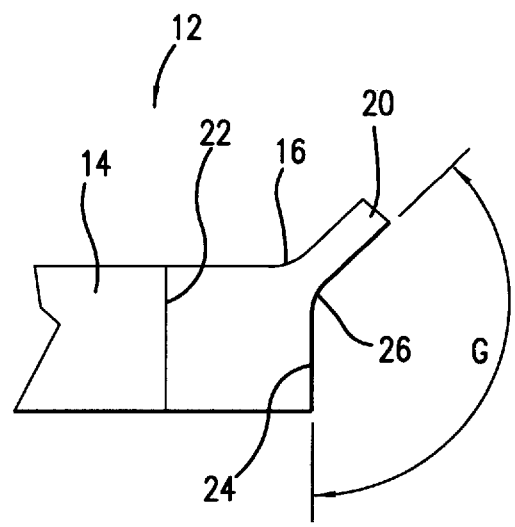
FIG. 7 is an enlarged cross-sectional view of another alternate embodiment of the electronic equipment casing according to the present invention.

Still another embodiment of the invention is shown in FIG. 7, which is an enlarged partial cross-sectional view of an upper cover 12. According to this embodiment, the gasket member 16 of the upper cover 12 has a sheet portion 20 inclined at an oblique angle G with reference to the end surface 24; the angle G should be between 90 degrees and 180 degrees. In this way, the resisting force of the sheet portion 20 can be adjusted, and the upper cover 12 can be readily brought into engagement with the lower case 2.

Figure 8:
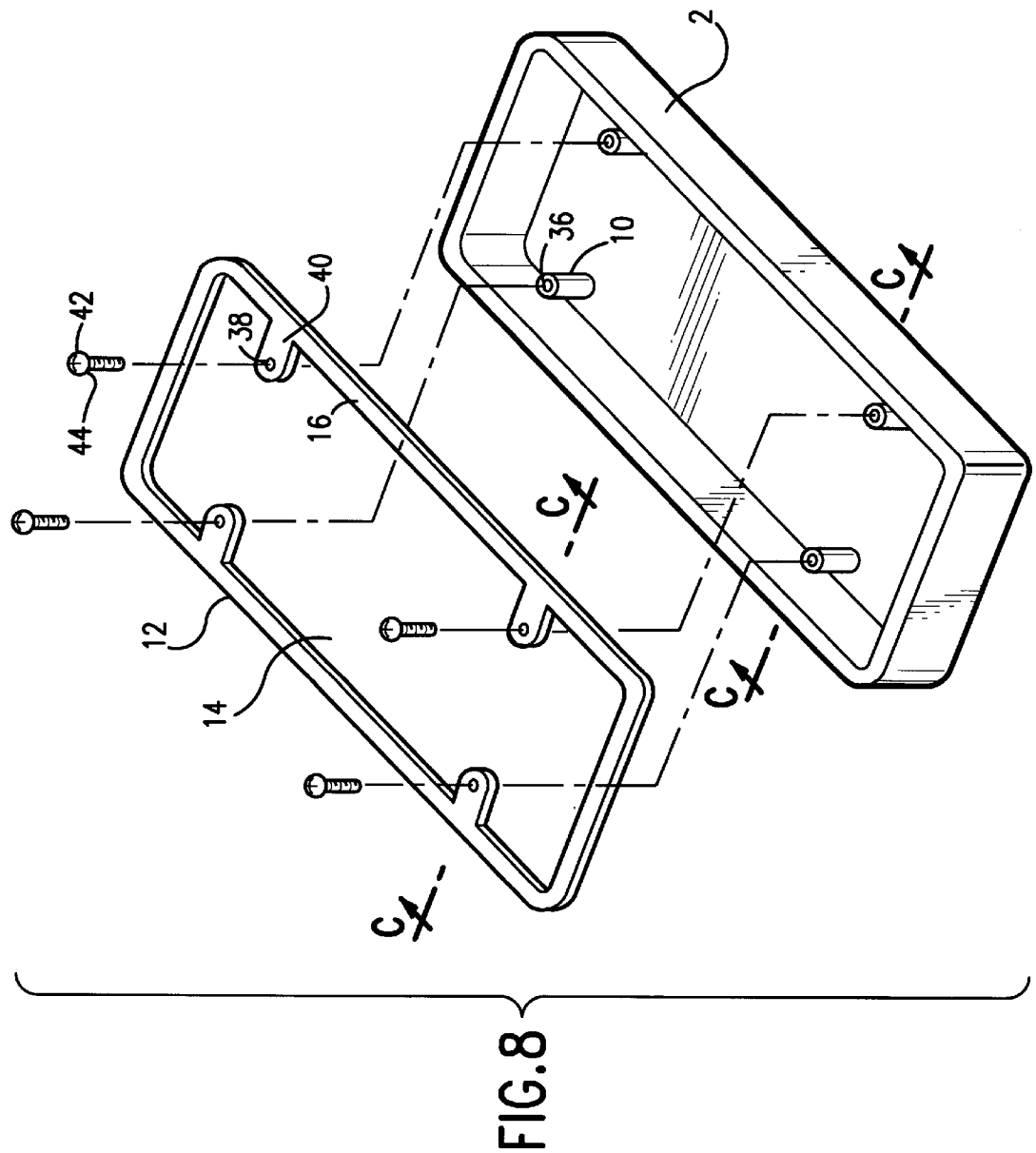
FIG. 8 is a perspective view of an additional embodiment of the electronic equipment casing according to the present invention.
Figure 9:
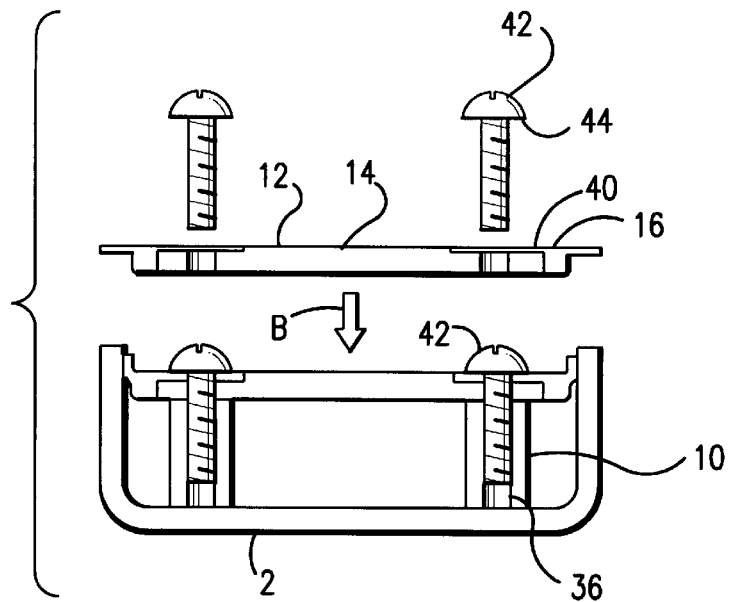
FIG. 9 is a cross-sectional view of the electronic equipment casing taken along line C—C of FIG. 8.

Yet another embodiment of the invention is shown in FIGS. 8 and 9. FIG. 9 is a sectional view taken along line C—C of FIG. 8. This embodiment illustrates one way to secure the upper cover to the lower case. In this embodiment, the lower case 2 has four projections 10, each having a threaded hole 36. The upper cover 12 has four holes 38 which are aligned with the corresponding threaded holed 36 of the lower case 2. Each hole 38 is surrounded by gasket portion 40 which extends from the peripheral gasket member 16 over the plate 14. The upper surface of gasket portion 40 is level with the surface of the plate 14, and is thinner than the plate 14. When the cover 12 is brought into engagement with the lower case 2, each screw 42 is inserted through a corresponding hole 38 and screwed into the threaded hole 36, with the screw head 44 pressing against the gasket portion 40. In this way, water is prevented from entering the casing through the holes 38. This embodiment thus provides a waterproof structure even when screws are used to secure the cover to the case.

Figure 10:
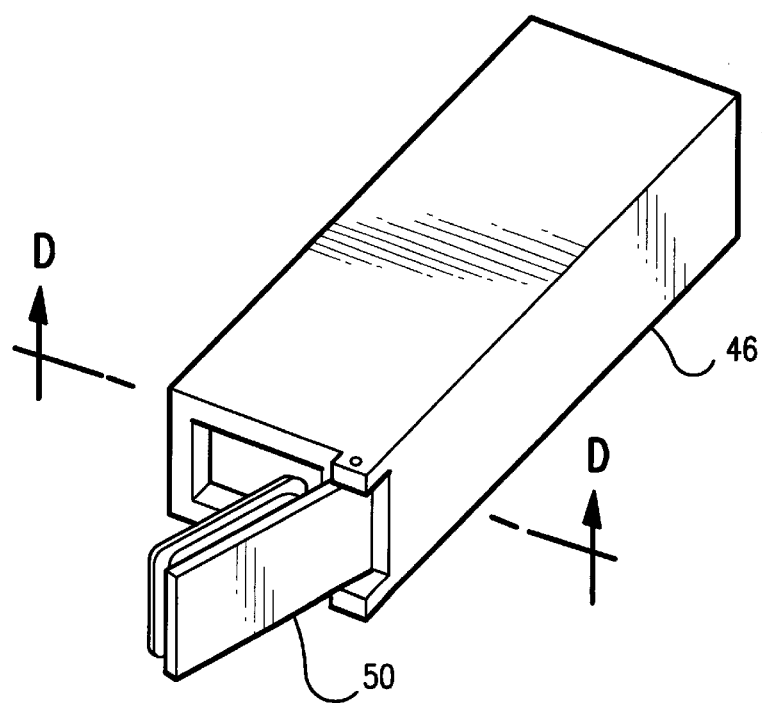
FIG. 10 is a perspective view of yet another embodiment of the electronic equipment casing according to the present invention.
Figure 11A:
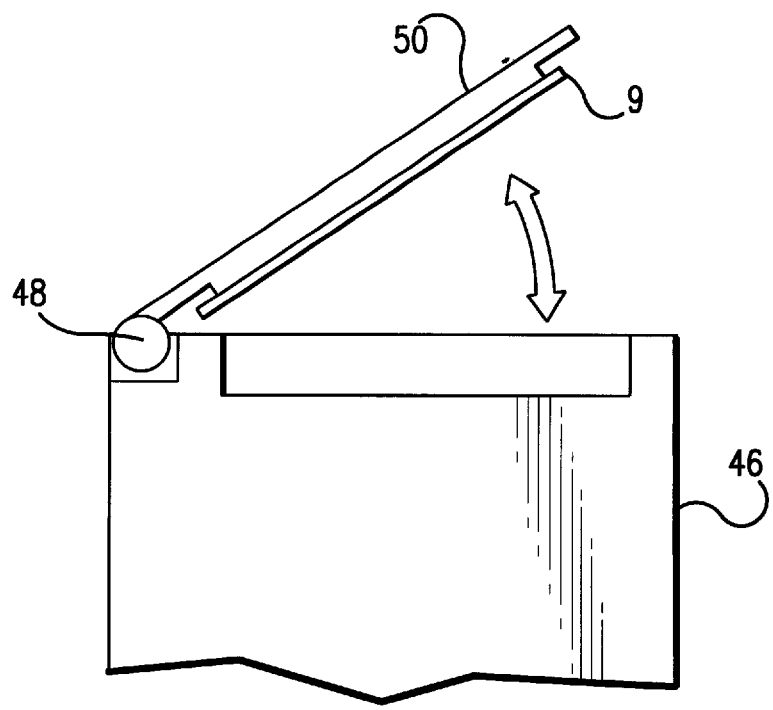
FIGS. 11(a) and 11(b) are cross-sectional views of the electronic equipment casing taken along line D—D of FIG. 10.
Figure 11B:
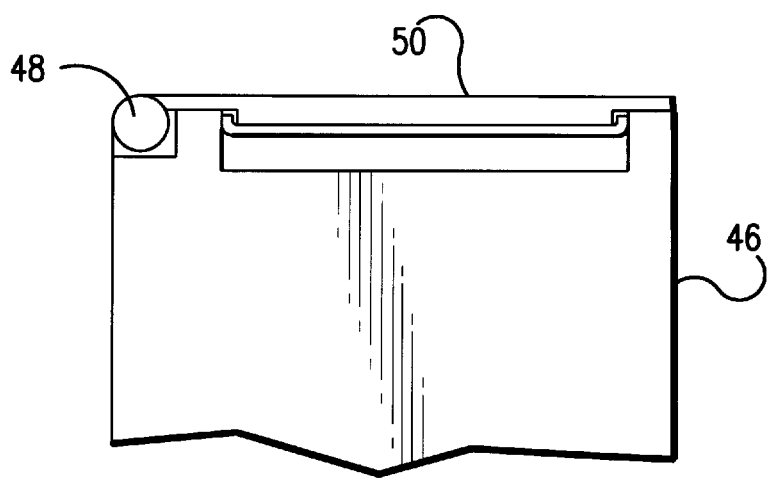

FIG. 10 and FIGS. 11(a) and 11(b) illustrate another alternate embodiment of the present invention. FIGS. 11(a) and 11(b) are both cross-sectional views taken along line D—D of FIG. 10. This embodiment shows a waterproof casing structure which has a mounted movable lid 50 as shown in a perspective view of FIG. 10. A case 46 is provided with a rotary shaft 48 for opening the lid 50 as shown in FIG. 11(a), and for closing the lid 50 as shown in FIG. 11(b). Lid 50 is rotatably mounted on the shaft 48. The waterproof structure of the lid 50 is similar to that shown in FIGS. 5(a) and 5(b).

Figure 12:
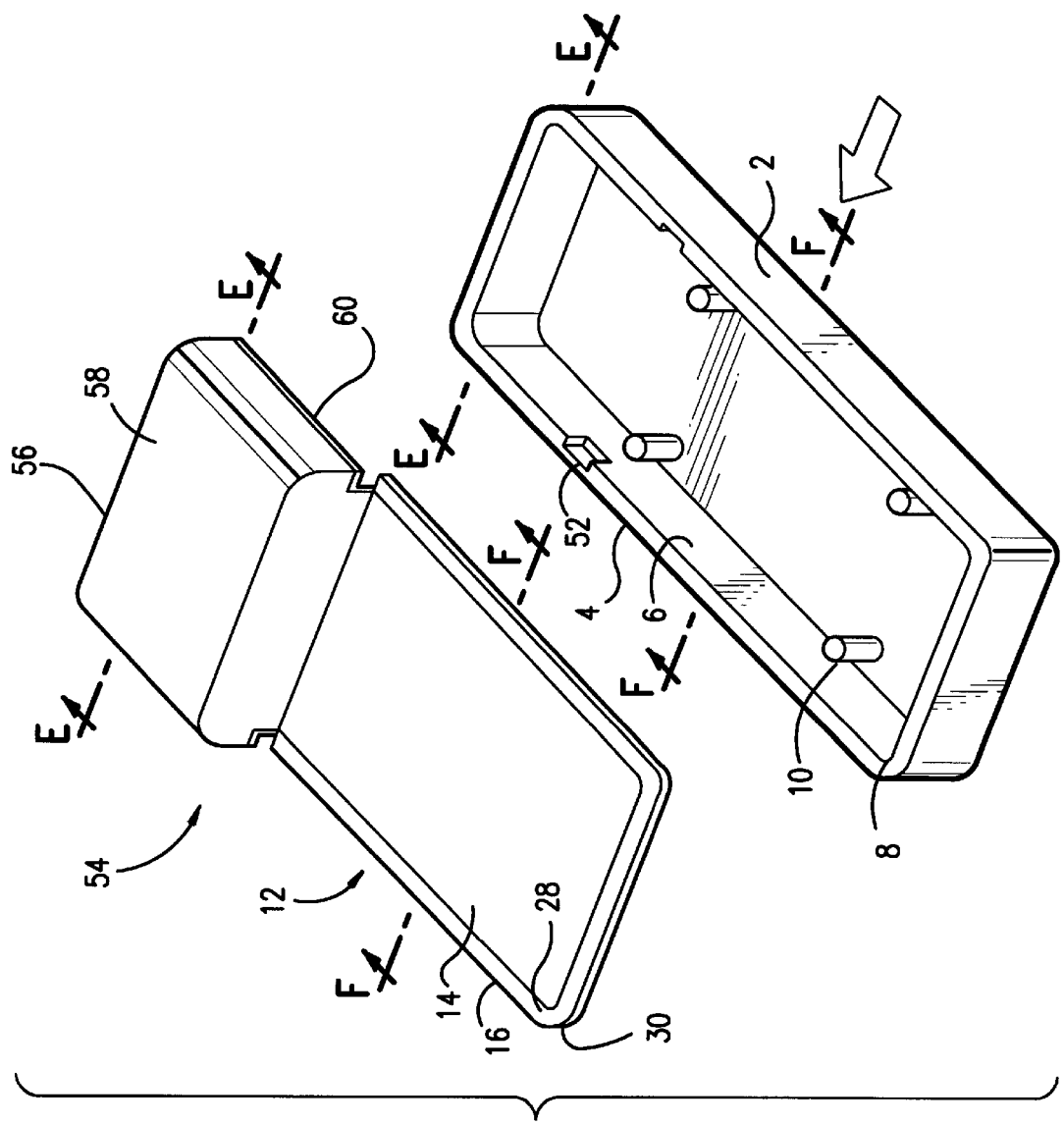
FIG. 12 is a perspective view of still another embodiment of the electronic equipment casing according to the present invention.
Figure 13:
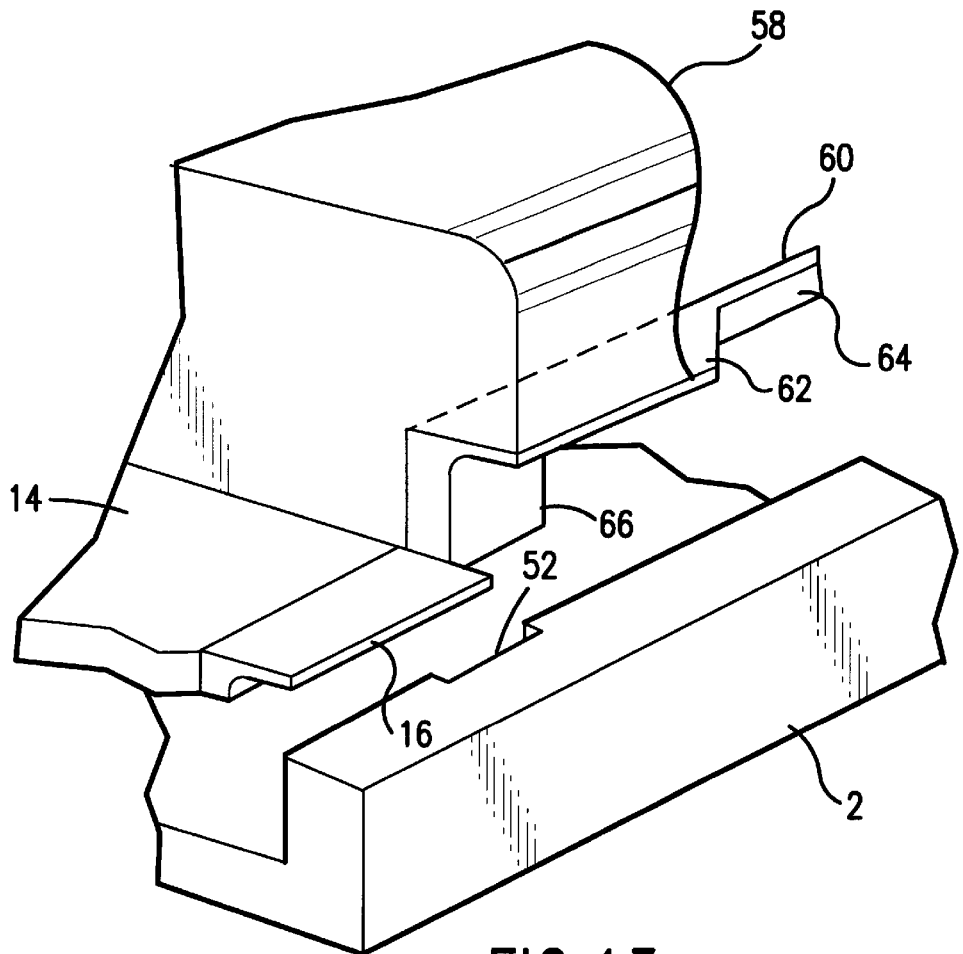
FIG. 13 is a perspective view of part of the electronic equipment casing shown in FIG. 12.

A further embodiment of the invention is illustrated in FIGS. 12 through 19. According to this embodiment, the casing structure is formed to accommodate a battery pack mounted on a cover member thereof. In this embodiment, the lower case 2 has a box shape with an opening in the top thereof. A pair of recesses 52 are formed in the inner side wall 6 of the rim 4 as shown in FIG. 12. The upper cover 54 is composed of a box-type member 56 and a flat cover member 12. FIG. 13 is an enlarged partial perspective view of the area where the box member 56 joins the cover member 12.

Figure 14:
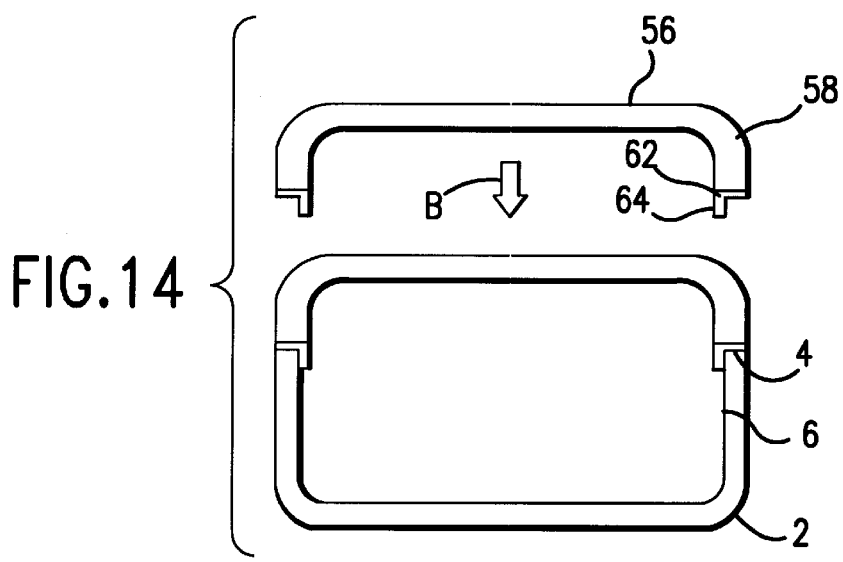
FIG. 14 is a cross-sectional view of the electronic equipment casing taken along line E—E of FIG. 12.
Figure 15:
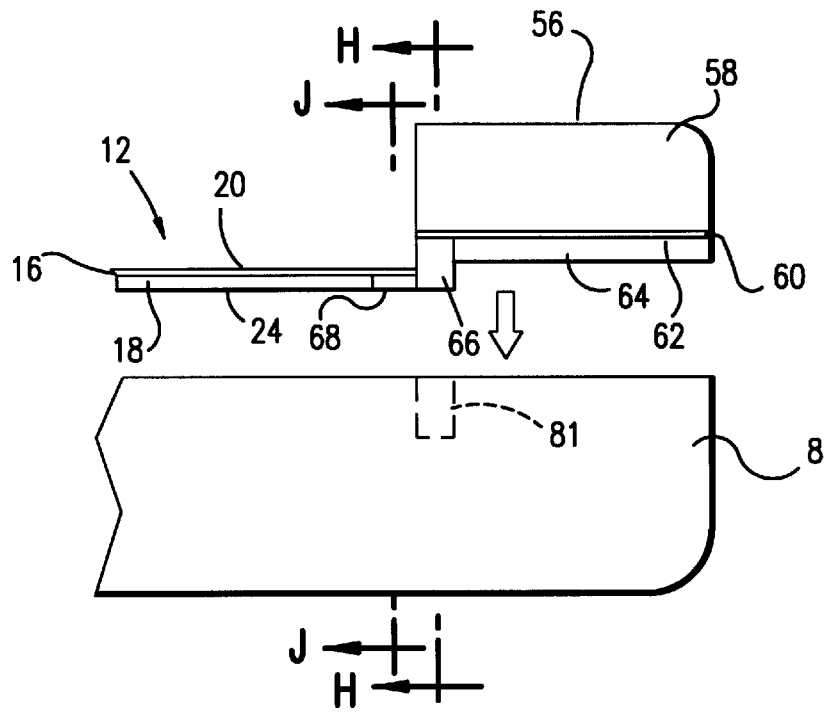
FIG. 15 is a partial side view of the electronic equipment casing viewed from the direction of arrow G of FIG. 12.
Figure 16:
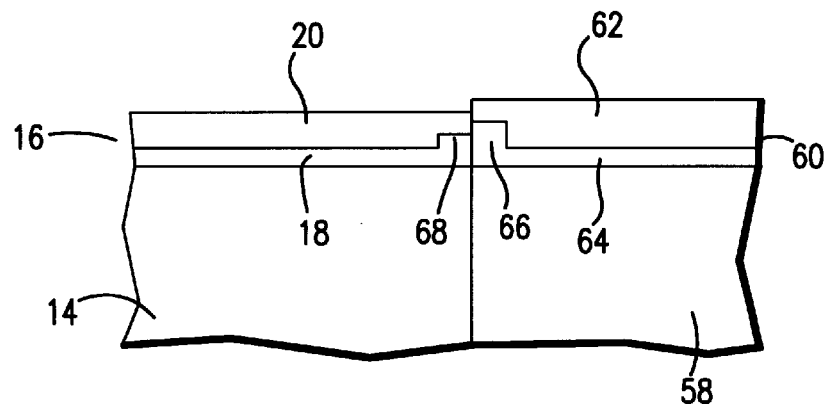
FIG. 16 is a partial end view of the electronic equipment casing viewed from above the cover member of FIG. 12.

The box member 56 has an opening in the bottom thereof and is composed of a case portion 58 and a gasket portion 60 joined to the case portion 58. The gasket portion 60 is generally L-shaped in cross section as shown in FIG. 14, which is taken along line E—E of FIG. 12. The gasket portion 60 has a flat base portion 62 and a guide portion 64. At the interface with the plate member 14, the gasket 60 has a projection 66 as shown in FIG. 13. The projection 66 is thicker than the guide portion 64 and extends to reach the plate member 14 as seen in FIGS. 15 and 16. The cover member 12 of the upper cover 54 has a shape similar to the previous embodiment explained with respect to FIG. 2 (a), and as further shown in cross-section in FIG. 17 (taken along line F—F of FIG. 12). The cover member 12 has a plate member 14 and a gasket member 16. At the interface with the case portion 58, the gasket member 16 has a projection 68. The projection 68 is thicker than the base portion 18 of the gasket 16 but is thinner than the projection 66 of the gasket portion 60 of box member 56.

The gasket portion 60 and the gasket member 16 respectively extend continuously around the case portion 58 and the plate member 14 and are formed integrally with the case portion 58 and plate member 14. The gasket portion 60 and the gasket member 16 are preferably made of a thermoplastic elastic resin.

Figure 18:
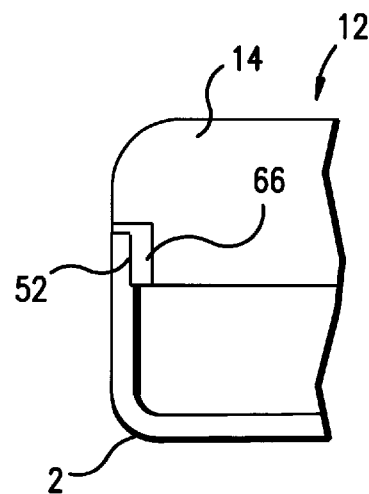
FIG. 18 is a cross-sectional view of the electronic equipment casing taken along line H—H of FIG. 15.

The box member 56 of this embodiment functions as follows. When the upper cover 54 is brought into engagement with the lower case 2, the guide portion 64 of the gasket 60 slides along and contacts the inside wall portion 6 of the case 2 and is pressed against the case 2 such that no space exists between the gasket 60 and the inside wall portion 6. The recesses 52 have the same shape as the projections 66 or slightly smaller so that the projection 66 can be fitted thereinto, with no space formed between them as shown in FIG. 18.

Figure 17:
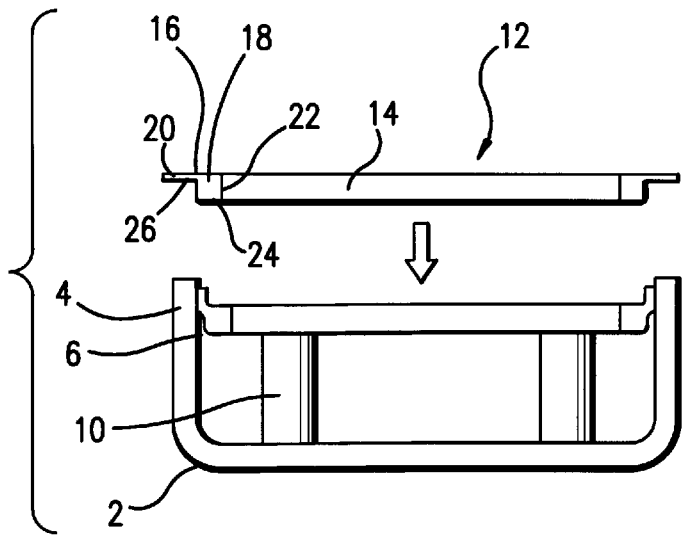
FIG. 17 is a cross-sectional view of the electronic equipment casing taken along line F—F of FIG. 12.
Figure 19:
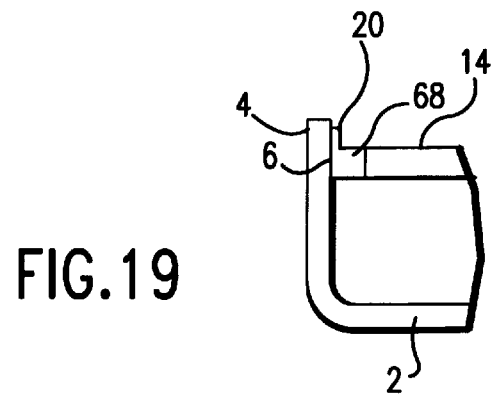
FIG. 19 is a cross-sectional view of the electronic equipment casing taken along line J—J of FIG. 15.

The cover member 12 of the upper cover 54 functions similarly to the previous embodiment of FIGS. 2(a) and 2(b), as shown in FIG. 17. At the interface with the box member 56, the projection 68 presses against the inside wall portion 6 as shown in FIG. 19, with no space remaining between the inside wall portion 6 and the projection 68.

Along the interface between the box member 56 and the plate member 14, projection 66 of the gasket portion 60 and the projection 68 of the gasket member 16 are formed continuously and integrally, and pressed against the lower case 2, so that no space is formed therebetween, thereby preventing entry of water droplets into the casing. This embodiment assures a waterproof casing structure for electronic equipment where one section of a cover member is formed in a box-like shape to house parts mounted in the cover. Modifications of this embodiment for the flat cover portion 12 of the upper cover 54 might include various of the waterproof structures described in the previous embodiments.

Figure 20:
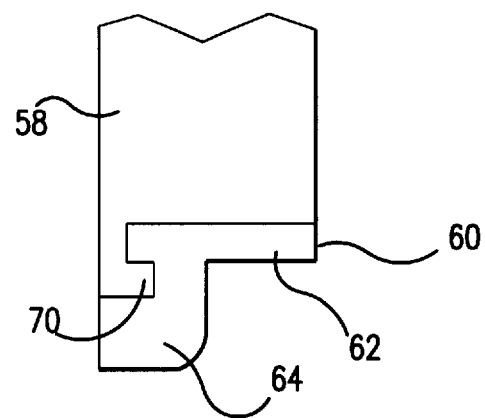
FIG. 20 is an enlarged cross-sectional view of a further embodiment of the electronic equipment casing according to the present invention.

FIG. 20 illustrates another embodiment of the invention, which is a modification of the box member 56 of the upper cover 54 of FIG. 12. In this embodiment, case portion 58 of box member 56 has a projecting section 70 which extends in a hook shape into guide portion 64 of gasket portion 60. In this way, there is a larger interface area for the gasket portion 60 to be heat bonded to the case portion 58, so that the heat bonding strength between the gasket portion 60 and the case portion 58 is increased. Consequently, the gasket portion 60 is prevented from easily peeling off the case portion 58.

The invention having been described, it will be apparent to those skilled in the art that various changes and modifications may be made in the invention without departing from the spirit and scope thereof. Any and all such modifications are intended to be within the scope of the following claims.

What is claimed is:

1. A waterproof casing for electronic equipment, comprising:

a case member and a cover member detachably engaged together to form a casing for accommodating electronic equipment, said cover member having a base portion and a gasket member provided around the periphery of said base portion, said gasket member having sliding contact with said case member along the circumference of an opening in said case member when said cover member is brought into detachable engagement with said case member, and wherein said base portion of said cover member has a plate form and said gasket member has a gasket base portion joined to a vertical end surface of said plate form base portion and a sheet portion extending outward from said gasket base portion, said sheet portion imparting said sliding contact, and said case member including at least one projection to receive said cover member, and said cover member is secure to said projection.

2. The waterproof casing according to claim 1, wherein said case member has a box form with said opening at an upper side to receive said cover member.

3. The waterproof casing according to claim 1, wherein said plate form base portion has a projection extending into said gasket base portion.

4. The waterproof casing according to claim 1, wherein said sheet portion of said gasket member forms an oblique angle with respect to the surface of said plate form base portion.

5. The waterproof casing according to claim 1, wherein said base portion and said gasket member are integrally formed as one unit.

6. The waterproof casing according to claim 1, wherein said case member and said base portion of said cover member are formed of a thermoplastic resin, and said gasket member is formed of a thermoplastic elastic resin.

7. The waterproof casing according to claim 1, wherein said base portion and said gasket member are integrally molded as one unit.

8. The waterproof casing according to claim 1, wherein said vertical end surface is substantially flat from a top end to a bottom end thereof.

9. The waterproof casing according to claim 1, wherein the entire said gasket sheet portion extends outward beyond said cover member such that said cover member does not prevent bending of said gasket sheet portion.

10. The waterproof casing according to claim 9, wherein a cross section of said gasket member is L shaped.

11. The waterproof casing according to claim 1, further including electronic equipment within said casing.

12. The waterproof casing according to claim 1, wherein said at least one projection includes a threaded hole and said gasket includes a corresponding portion which extends inward over said base portion of said cover member from a periphery of the gasket to seal said cover member above said threaded hole.

13. The waterproof casing according to claim 1, wherein said gasket member extends outward around the entire periphery of said base portion.

14. The waterproof casing according to claim 1, wherein a smooth-transition round corner portion is provided between said gasket base portion and said sheet portion extending outward from said gasket base portion.

15. The waterproof casing according to claim 1, wherein said cover member includes a box-form member joined to said base portion, said gasket member being provided around a portion of the periphery of said base portion between said base portion and said opening in said case.

16. A waterproof casing for electronic equipment, comprising:

a case member and a cover member detachably engaged together to form a casing for accommodating electronic equipment, said cover member having a base portion and a gasket member provided around the periphery of said base portion, said gasket member having sliding contact with said case member along the circumference of an opening in said case member when said cover member is brought into detachable engagement with said case member, and wherein said base portion of said cover member has a plate form with upper and lower major surfaces, and said gasket member is joined to one of said major surfaces of said plate form base portion and extends over the periphery of said plate-form base portion, and said case member including at least one projection to receive said cover member, and said cover member is secure to said projection.

17. The waterproof casing according to claim 16, wherein said base portion and said gasket member are integrally formed as one unit.

18. The waterproof casing according to claim 16, wherein said base portion and said gasket member are integrally molded as one unit.

19. The waterproof casing according to claim 16, wherein said case member and said base portion of said cover member are formed of a thermoplastic resin, and said gasket member is formed of a thermoplastic elastic resin.

20. The waterproof casing according to claim 16, wherein said case member has a box-form with said opening at an upper side to receive said cover member.

21. The waterproof casing according to claim 16, further including electronic equipment within said casing.

22. The waterproof casing according to claim 16, wherein said gasket member extends outward around the entire periphery said base portion.

23. The waterproof casing according to claim 16, wherein said cover member includes a box-form member joined to said base portion, said gasket member extending outward around a portion of the periphery of said base member between said base member and said opening in said case.

* * * * *